United States Patent
Hematy

(10) Patent No.: US 11,056,875 B2
(45) Date of Patent: Jul. 6, 2021

(54) SYSTEMS AND METHODS FOR GATE DRIVER WITH FIELD-ADJUSTABLE UVLO

(71) Applicant: Maxim Integrated Products, Inc., San Jose, CA (US)

(72) Inventor: Arman Hematy, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 302 days.

(21) Appl. No.: 16/245,014

(22) Filed: Jan. 10, 2019

(65) Prior Publication Data

US 2019/0267793 A1    Aug. 29, 2019

Related U.S. Application Data

(60) Provisional application No. 62/634,683, filed on Feb. 23, 2018.

(51) Int. Cl.
*H02H 3/24* (2006.01)
*H02H 7/122* (2006.01)
*H02M 1/088* (2006.01)
*H03K 17/689* (2006.01)

(52) U.S. Cl.
CPC .......... *H02H 3/243* (2013.01); *H02H 7/1222* (2013.01); *H02M 1/088* (2013.01); *H03K 17/689* (2013.01)

(58) Field of Classification Search
CPC ....... H02H 3/243; H02H 7/1222; H02M 1/08; H02M 1/088; H02M 3/33553; H03K 17/063; H03K 17/223; H03K 17/689; H03K 17/78; H03K 17/785; H03K 2217/0081
See application file for complete search history.

(56) References Cited

U.S. PATENT DOCUMENTS

| | | | |
|---|---|---|---|
| 5,793,596 A | * | 8/1998 | Jordan .................. H02H 3/025 361/18 |
| 7,187,226 B2 | | 3/2007 | Audy |
| 8,487,664 B2 | | 7/2013 | Draxelmayr et al. |
| 8,614,595 B2 | | 12/2013 | Acatrinei |
| 10,236,677 B2 | * | 3/2019 | Naito ..................... H02H 3/087 |
| 2012/0133397 A1 | * | 5/2012 | Draxelmayr ...... H02M 3/33553 327/81 |

OTHER PUBLICATIONS

Enable Functionality and Adjusting Undervoltage Lockout for TPS57112-Q1 [online]. ti.com [retrieved on Jun. 9, 2016]. Retrieved from the Internet: <URL: https://www.ti.com/lit/an/slva784/slva784.pdf?ts=1609183010736&ref_url=https%253A%252F%252Fwww.google.com%252F> (Year: 2016).*

* cited by examiner

*Primary Examiner* — Jared Fureman
*Assistant Examiner* — Nicolas Bellido
(74) *Attorney, Agent, or Firm* — North Weber and Baugh LLP; Michael North

(57) ABSTRACT

Systems and methods for gate driver with field-adjustable undervoltage lockout (UVLO) are disclosed. A gate driver system comprises a control circuit and a driver circuit. The driver circuit incorporates a field-adjustable UVLO, a control logic, and an inverter. The level of the field-adjustable UVLO is adjustable by an external circuit, which can be a resistor based voltage divider. By setting the UVLO level externally adjustable and by moving a reference ground to the external voltage divider, the gate driver system is able to implement gate control for various load without needing extra ground pin.

20 Claims, 3 Drawing Sheets

SYSTEMS AND METHODS FOR GATE DRIVER WITH FIELD-ADJUSTABLE UVLO

CROSS-REFERENCE TO RELATED APPLICATION

This application claims the priority benefit under 35 U.S.C. § 119(e) to U.S. Provisional Patent Application No. 62/634,683, entitled "SYSTEMS AND METHODS FOR GATE DRIVER WITH FIELD-ADJUSTABLE UVLO," naming as inventor Arman Hematy, and filed Feb. 23, 2018, which application is hereby incorporated herein by reference in its entirety.

TECHNICAL FIELD

The present disclosure relates generally to systems and methods for electrical circuits. More particularly, the present disclosure related to systems and methods for gate driver circuits.

BACKGROUND

Gate driver circuits are used to drive, e.g., a semiconductor device, such as an Insulated Gate Bipolar Transistor (IGBT) and are oftentimes configured to protect the semiconductor device from physical damage. As will be appreciated by those skilled in the art, gate driver circuits utilizes a microprocessor to drive a separate high voltage circuit, which may be in the range of hundreds or thousands of volts, within the same package. The controller side is isolated from the driver side using electrical isolation techniques, such as capacitive coupling or optical isolation. Given the continued trend to miniaturization of package sizes, circuit designers are now at a limit where they encounter the physical limitations of miniaturization. Especially, breakdown voltages prevent circuits from further miniaturization.

In addition, gate drivers are very sensitive to the voltage that activates or deactivates the gate driver. The required accuracy for this voltage depends mainly on the accuracy of the output voltage of an undervoltage lockout (UVLO) circuit, which is used to turn off the power of an electronic device in the event of the voltage dropping below a threshold voltage. Typically, the UVLO internally sets that voltage, which is referenced with respect to a reference voltage, which may be a reference ground or the lowest supply voltage in the gate driver circuit.

As various semiconductor devices having differing voltages, efficiencies, and price requirements enter the market, gate driver suppliers are forced to accommodate the various designs by designing and offering gate drivers that have UVLOs that operate at separate and distinct voltage levels. In other words, each particular power transistor design requires a particular model of gate driver that operates with a specific UVLO voltage level. Therefore, it is very costly to make different designs to accommodate different variations or models of interfacing circuits, microprocessors, inverters, and the like.

Therefore, it would be desirable to have gate drivers with adjustable UVLO levels to accommodate various voltage requirements without involving costly redesigns.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIGURE ("FIG.") 1 is a circuit diagram for a gate driver system with UVLO level set internally according to various embodiments of the invention.

Figure 1:
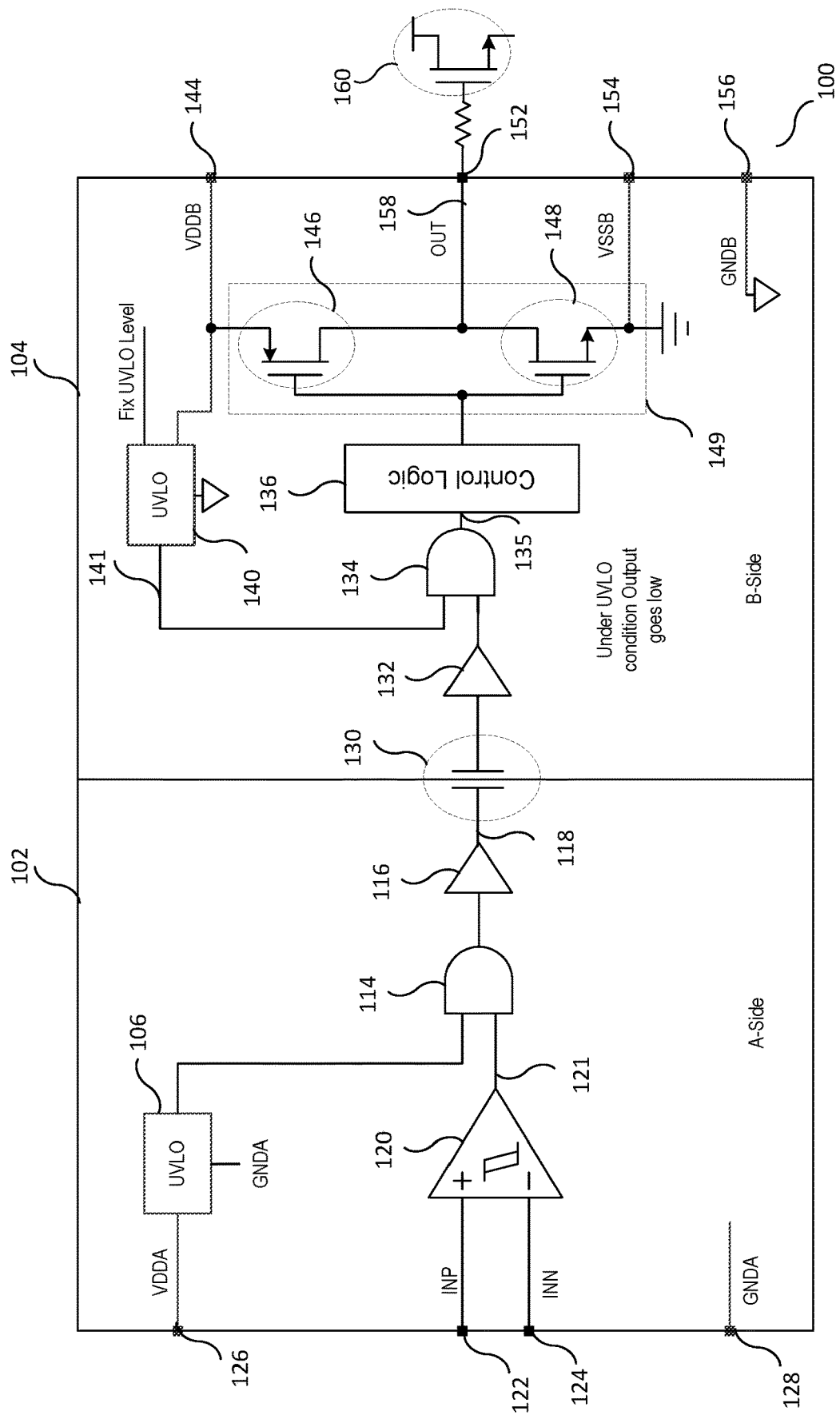

One skilled in the art will recognize that various implementations and embodiments of the invention may be practiced in accordance with the specification. All of these implementations and embodiments are intended to be included within the scope of the invention.

DETAILED DESCRIPTION OF EMBODIMENTS

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in hardware, software, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. Furthermore, the use of memory, database, information base, data store, tables, hardware, and the like may be used herein to refer to system component or components into which information may be entered or otherwise recorded.

Furthermore, it shall be noted that: (1) certain steps may optionally be performed; (2) steps may not be limited to the specific order set forth herein; (3) certain steps may be performed in different orders; and (4) certain steps may be done concurrently.

In this document the terms node and pin are used interchangeably. The term "pin" as used herein refers to any location in an electric circuit and that is accessible to a voltage measurement or is accessible for impressing a voltage or current.

FIG. 1 depicts a circuit diagram for a gate driver system 100 with UVLO level set internally according to various embodiments of the invention. The system 100 comprises a control circuit 102 to output a control signal 118. The control circuit 102 comprises comparator 120, under-voltage lockout (UVLO) circuit 106, logic circuits 114, 116. The control circuit 102 may comprise input pins 122, 124 and power supply pin 126 VDDA and ground pin GNDA 128, with pin VDDA 126 being defined relative to GNDA. Comparator 120 may be any differential logic that comprises two inputs 122 and 124, e.g., a positive and a negative input. In embodiments, comparator 120 may have a built-in hysteresis characteristic that prevents output 121 of comparator 120 from oscillating between low and high values, thus, in effect, reducing input noise, such as noise that may be present on a signal line carrying a pulse-width-modulated signal. In embodiments, the control circuit 102 may be a low voltage-side circuit that comprises a microprocessor (not shown in FIG. 1). The control circuit 102 may be implemented, for example, in a computer, such as a board computer in a vehicle (not shown).

In embodiments, the system 100 further comprises a driver circuit 104 which comprises UVLO 140, control logic 136, logic circuits 132, 134, and inverter 149 that comprises transistor devices 146 and 148, e.g., PMOS and NMOS transistors, that may be coupled to output pin 152. Circuit 104 may further comprise pins VDDB 144, GNDB 156, OUTPUT 152, and VSSB 154. The pin VDDB 144 and the pin VSSB 154 receive respectively a positive supply voltage and a negative supply voltage with reference to pin GNDB 156, which is a signal ground or a reference ground. In embodiments, UVLO 140 also couples to the signal ground such that UVLO 140 is able to identify voltage level of pin VDDB with reference to the signal ground. UVLO 140 in circuit 104 may comprise a comparator and a reference voltage.

In embodiments, circuit 104 may be a high-voltage side circuit, e.g., a power transistor driver circuit that is coupled to a high voltage load, such a high voltage electric motor. In embodiments, the two sides may be electrically isolated from each other by some isolation circuit. As depicted in FIG. 1, a capacitor 130 serves an isolation component in system 100. However, this is not intended as a limitation on the present in invention as any other method of electrical isolation may be used, e.g., galvanic or optical isolation.

In embodiments, the control circuit 104 may use DC power supplies received at VDDB pin 144 and VSSB pin 154 to drive transistor devices 146 and 148. Also shown in FIG. 1 is a load, e.g., a high-voltage side power transistor 160, such as an IGBT that may be selectively coupled to output pin 152 in system 100, e.g., via a series resistor. In embodiments, pin VSSB 154 is connected to an earth ground for consideration of safety, limiting static electricity build-up, and/or electromagnetic compatibility.

In operation, in embodiments, UVLO circuit 140 uses a comparator to monitor the input supply voltage at pin VDDB 144 and generates UVLO signal output 141 that indicates the status of the UVLO (or the status of input voltage at pin VDDB 144). In embodiments, the voltage level of UVLO circuit 140 is fixed and set internally to define the difference between the voltages at pins VDDB 144 and reference ground.

In embodiments, if the input supply voltage at pin VDDB 144 becomes sufficiently high, e.g., 12V, for proper operation of circuit 100, UVLO 140 may output a logic 1 that is received by AND gate 134. As a result, control logic 136 may control inverter 149 to output a driver output signal 158 via the output pin 152 that ultimately determines the state of the load. In other words, high-voltage side circuit 104 "sees" what is happening on the low-voltage side circuit 102, such that whatever occurs on the side 102 will have an effect on the driver output signal 158.

Conversely, in embodiments, e.g., in response to the input voltage at pin VDDB 144 to UVLO 140 falling below a desired supply voltage, UVLO 140 may output logic "0" that is received by AND gate 134. As a result, UVLO circuit 140 causes circuit 104 to be deactivated, such that no communication occurs between the input of control circuit 102 and the output of circuit 104. In other words, in response to the UVLO being triggered, the logic circuit (AND gate 134) functions to disable communication between the control signal and the driver output. This may effectively protect the load and prevent circuit instabilities and/or degraded system performance that may result from overvoltage conditions that may arise, e.g., at power-up. In embodiments, by cutting off power to the load, UVLO 140 protects an electrical motor from potential damages. Once the input voltage at pin VDDB 144 satisfies a UVLO threshold, i.e., the supply voltage is sufficiently high, the circuit 100 may resume regular operation.

In embodiments, control logic 136 may control the inverter 149 in a manner such as to drive a gate coupled to output, for example, with a sinusoidal waveform. A person of skill in the art will understand that pin 152 may be electrically floating with the gate at a relatively high voltage. Similarly, pins GNDB 156, VDDB 144, and VSSB 154 may be electrically floating, similar to the terminals of the secondary winding of an ungrounded transformer. In embodiments, the voltage at pins VDDB 144 may be defined as a relatively low voltage, e.g., 5V or 12V, or any another voltage that may depend on a particular application, above the GNDB 156. Similarly, the voltage at node VSSB 154 may also be at 5V or 12V below the reference ground at pin GNDB 156.

In embodiments, the voltage difference between GNDA and GNDB may be relatively large, e.g., more than 1000 V, with GNDB being the larger of the two voltages. As a result, VDDB will also be more than 1000 V above the voltage at node GNDA.

In embodiments, the output pin 152 couples to an external switch 160 (e.g., an IGBT) that drives a load, such an electric motor (not shown in FIG. 1). In embodiments, the output pin 152 couples to the external switch 160 via an external resistor 162. When NMOS transistor 148 at the bottom of inverter 149 turns on, the output pin 152 couples to pin VSSB 154. Therefore, the output voltage falls below the reference ground GNDB to deactivate the switch 160 (e.g., by causing the gate voltage of the switch to fall below the transistor source voltage, i.e., Vgs becomes negative).

By doing so, the system 100 cuts off power to the electric motor. Conversely, if PMOS transistor 146 at the top of inverter 149 turns on, the output pin 152 couples to pin VDDB 144, enabling the output voltage at the output pin 152 higher than the reference ground GNDB to activate the switch 160 such that the electric motor is powered.

In embodiment, the switch 160 may be a power transistor, such as an IGBT, SiC, GaN-type power MOSFET, or any other semiconductor device known in the art or developed in the future. However, each type of semiconductor device requires a different control voltage. For example, an IGBT may require 12V between pins VSSB 154 and VDDB 144, whereas a driver using SiC may require 15V and, thus cannot be driven with the same gate driver that is used to drive an IGBT. Similarly, a GaN switch may not be able to handle more than 6V and may suffer short term or permanent damage when operated at 12V or 15V. Therefore, different gate drivers with different UVLO circuits may have to be designed to accommodate each type of semiconductor device.

Figure 2:
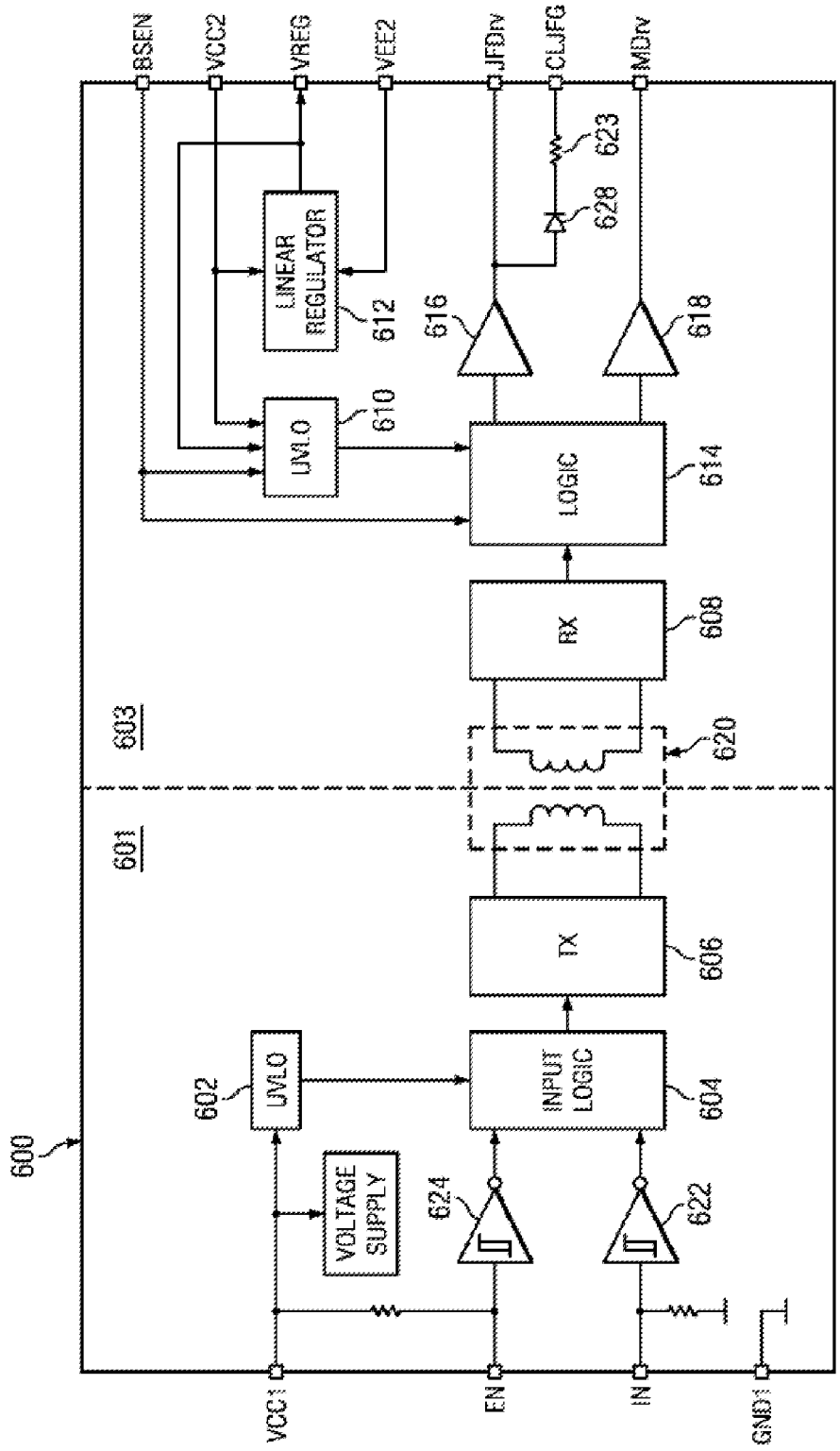
FIG. 2 is a circuit diagram for a prior art gate driver with multiple pins for an internal linear regulator to provide regulated voltage to a UVLO.

Some existing approaches attempt to solve this problem by adding pins to a given circuit design. However, those approach are highly undesirable, as the number of additional pins increases package size, does not present a "drop-in" replacement solution, and adds significant engineering cost to both suppliers and their customers. U.S. Pat. No. 8,487,664 discloses a driver circuit incorporating a linear regulator to provide a regulated voltage to a UVLO, as shown in FIG. 2. The Driver circuit 600 has low voltage section 601 coupled to high voltage section 603 via transformer 620. Low voltage section 601 accepts driver data at pin IN, which is coupled to transformer 620 via buffer 622, input logic 604 and transformer driver 606. High voltage section 603 has a transformer receiver 608, driver logic 614, JFET driver 616, and MOSFET driver 618. Linear regulator 612 incorporated in the high voltage section 603 provides regulated voltage VREG from voltage input via VCC2 and VEE2 pins to the UVLO 610. Such a configuration requires additional PINs (VEE2 at least) for linear regulator voltage input. To make the linear regulator adjustable, additional external circuit is still required. The extra PINs together with additional external circuit for adjustability cause extra complexity and cost for end-users.

Figure 3:
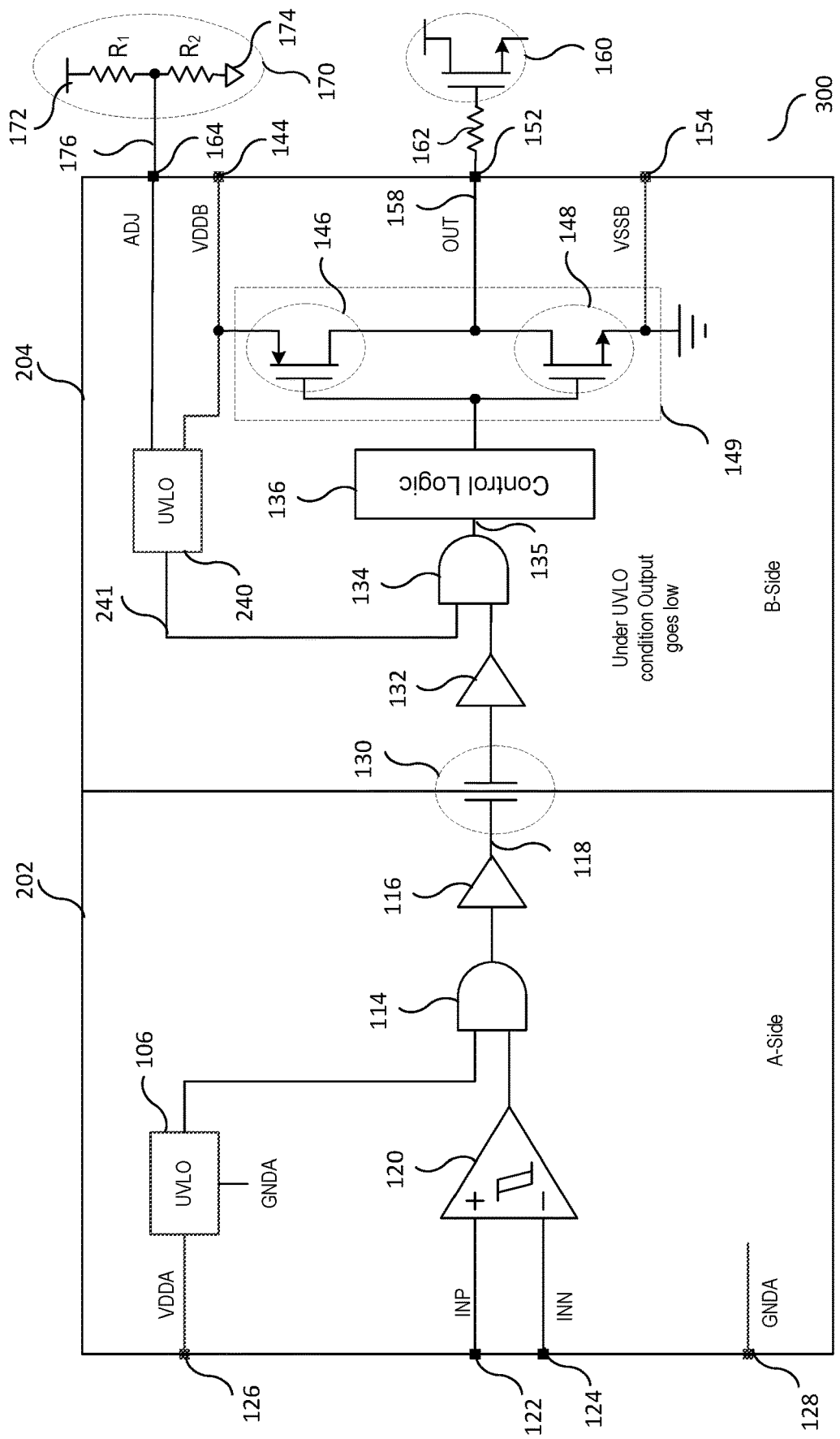
FIG. 3 is a circuit diagram for a gate driver system with field-adjustable UVLO level without needing extra pins according to various embodiments of the invention.

FIG. 3 is a circuit diagram for a gate driver system 300 with field-adjustable UVLO level without needing extra pins according to various embodiments of the invention.

Similar to the system 100 shown in FIG. 1, the system 300 also comprises a driver circuit 204 and a control circuit 202, which may be the same as the control circuit 102 shown in FIG. 1. Similar to the driver circuit 104, the driver circuit 204 comprises UVLO 240, control logic 136, logic circuits 132, 134, and inverter 149 that comprises transistor devices 146 and 148, e.g., PMOS and NMOS the transistors, that may be coupled to output pin 152. Circuit 204 may further comprise pins VDDB 144, OUTPUT 152, and VSSB 154. The pin VDDB 144 and the pin VSSB 154 receive respectively a positive supply voltage and a negative supply voltage with reference to a reference ground or signal ground 174, which is external to the driver circuit 204 instead of being a PIN on the driver circuit 204.

One significant difference between the UVLO 240 and the UVLO 140 is that the voltage level of UVLO circuit 240 is adjustably set by an external circuit 170 to define the difference between the voltages at pins VDDB 144 and VSSB 154. In one or more embodiments, the external circuit 170 comprises a reference ground or signal ground 174 such that the reference ground is provided to the whole driver circuit 204 via the UVLO 240 only. In one or more embodiments, voltage at pin VDDB 144 may be above the reference ground and voltages at pin VSSB 154 may be below the reference ground. The final output signal 158 from the output pin 152 may be above or below the reference ground, depending on control signal. Compared to the embodiment in FIG. 1, the configuration shown in FIG. 3 achieves adjustable or field settable UVLO level for more flexibility without requiring any additional pins (the same pin numbers are used), therefore provides a more robust solution for gate driver.

In embodiments, the external circuit 170 is a voltage divider coupled to a voltage source 172, e.g. a 16V voltage source, to output an external voltage 176. The voltage divider may be a resistor-based voltage divider comprising a first resistor R1 and a second resistor R2 in series connection to the first resistor R1. The first resistor R1 coupled to the voltage source 172 and the second resistor R2 couples to the signal ground 174. The UVLO 240 received an external voltage 176 via an ADJ (which means adjustable) pin 164, which couples to the joint between the first resistor R1 and a second resistor R2. At least one of the first resistor R1 and the second resistor R2 is variable such that the external voltage 176 may be adjusted according to the switching requirement of the external switch 160. A person of skill in the art shall understand that the functions of resistive voltage divider 170 may equally be performed by any other divider, such as a capacitive divider.

In one or more embodiments, the VDDB pin 144 is coupled to the voltage source 172 in the external circuit 170. Such a configuration makes the UVLO 240 into an adjustable UVLO. By varying the voltage at ADJ pin 164 through adjusting the first resistor R1 and/or the second resistor R2, the trigger point(s) of UVLO 240 may be adjusted according to desired power supply voltages VDDB and VSSB. In embodiments, the adjustment may be accomplished by a user to set the desirable UVLO voltage level in the field. As a result, different required power transistor voltages may be accommodated using the same gate driver system 300 (i.e., same control logic 136, same inverter circuit 149, etc.).

One advantage of the drive circuit 204 is that the drive circuit 204 uses the same number of pins as the driver circuit 104. By using the GNDB pin 156 in FIG. 1 as the ADJ pin 164 in FIG. 3 to receive an adjustable voltage input (and using UVLO 240 instead of UVLO 140), the driver circuit 204 may be configured to provide an output voltage to accommodate various switching requirements. By selecting or adjusting the resistor R1 and/or the resistor R2, the voltage at the ADJ pin 164 may be set at a desired value, e.g. 2V, such that the UVLO 240 may be triggered at a desired voltage, e.g. according to requirements of the external switch 160.

In embodiments, UVLO 240 uses a comparator to monitor the input supply voltage at pin VDDB 144 and generates a UVLO output signal 241 that indicates the status of the UVLO 240 (or the status of input voltage at pin VDDB 144). If the input supply voltage at pin VDDB 144 becomes sufficiently high, e.g., 12V, for proper operation of gate driver system 300, UVLO 240 may output logic "1" that is received by AND gate 134 to generate a logic output 135, which has the same status as the control signal. As a result, control logic 136 may control inverter 149 to output a voltage to output pin 152 that ultimately determines the state of the load. When the input voltage at pin VDDB 144 to UVLO 240 falling below a desired supply voltage, UVLO 240 may output logic "0" that is received by AND gate 134 to generate a logic output 135 as "0". As a result, UVLO circuit 240 causes circuit 204 to be deactivated, such that no communication occurs between the input of control circuit 202 and the output of circuit 204. In other words, in response to the UVLO being triggered, the logic circuit (AND gate 134) functions to disable communication between the control signal and the driver output.

Although the foregoing discussion with respect to UVLO 240 is focused mainly on input voltage VDDB at pin 144, one skilled in the art shall understand that such implementation may also be applicable to monitor input voltage VSSB at pin 154.

The foregoing description of the invention has been described for purposes of clarity and understanding. It is not intended to limit the invention to the precise form disclosed. Various modifications may be possible within the scope and equivalence of the application. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A gate driver system comprising:
   a control circuit outputs a control signal;
   an external circuit comprising a reference ground, the external circuit outputs an external voltage; and
   a driver circuit couples to the control circuit, the driver circuit comprising:
      an adjustable undervoltage lockout (UVLO) coupled to the external circuit for providing the reference ground to the driver circuit, the adjustable UVLO receives the external voltage and a supply voltage to generate an UVLO output signal indicating a status of supply voltage, the adjustable UVLO has a trigger point adjustably determined by the external voltage;
      a logic circuit receives the control signal and the adjustable UVLO output signal to generate a logic output signal;
      an inverter receives the logic output signal to generate a driver output for gate control, in response to the adjustable UVLO being triggered, the logic circuit decouples communication between the control signal and the driver output.

2. The gate driver system of claim 1 wherein the external circuit is a voltage divider coupled to a voltage source to provide the external voltage, the supply voltage to the adjustable UVLO is provided by the voltage source.

3. The gate driver system of claim 2 wherein the voltage divider is a resistive voltage divider comprising at least one variable resistors such that the external voltage is adjustable.

4. The gate driver system of claim 3 wherein the supply voltage is a positive voltage with reference to the reference ground.

5. The gate driver system of claim 1 wherein the driver circuit couples to the control circuit with electrical isolation.

6. The gate driver system of claim 1 wherein the electrical isolation is implemented via capacitive coupling or optical isolation.

7. The gate driver system of claim 1 wherein the logic circuit is an AND gate.

8. The gate driver system of claim 1 wherein the inverter is driven by at least the supply voltage.

9. A gate driver circuit comprising:
   a voltage divider coupled to a supply voltage to provide an external voltage with reference to a reference ground;
   an adjustable undervoltage lockout (UVLO) coupled to the voltage divider for providing the reference ground to a driver circuit, the adjustable UVLO receives the supply voltage and the external voltage, the adjustable UVLO generates an UVLO output signal indicating a status of the supply voltage, the adjustable UVLO has a trigger point adjustably determined by the external voltage;
   a logic circuit receiving a control signal and the UVLO output signal to generate a logic output signal; and
   an inverter receiving the logic output signal to generate a driver output for gate control, in response to the adjustable UVLO being triggered, the logic circuit disables communication between the control signal and the driver output.

10. The gate driver of claim 9 wherein the logic circuit is an AND gate.

11. The gate driver of claim 9 wherein the inverter is driven by at least the supply voltage.

12. The gate driver of claim 9 wherein the voltage divider is a resistive voltage divider comprising at least one variable resistor such that the external voltage is adjustable.

13. A method for gate driving, the method comprising:
   receiving, at an adjustable undervoltage lockout (UVLO), an external voltage and a supply voltage referenced to a reference ground external to the adjustable UVLO;
   generating, by the adjustable UVLO, an UVLO output signal indicating a status of the supply voltage, the external voltage is adjustable to determine a trigger point of the adjustable UVLO;
   receiving, at a logic circuit, a control signal and the UVLO output signal to generate a logic output signal; and
   receiving, at an inverter, the logic output signal to generate a driver output for gate control, in response to the adjustable UVLO being triggered, the logic circuit decouples communication between the control signal and the driver output.

14. The method of claim 13 wherein the logic circuit receives the control circuit with electrical isolation.

15. The method of claim 14 wherein the electrical isolation is a capacitive coupling or an optical isolation.

16. The method of claim 13 wherein the external circuit is a voltage divider coupled to a voltage source to provide the external voltage, the supply voltage to adjustable UVLO is provided by the voltage source.

17. The method of claim 16 wherein the voltage divider is a resistive voltage divider comprising at least one variable resistors such that the external voltage is adjustable.

18. The method of claim 13 wherein the supply voltage is a positive voltage with reference to the reference ground.

19. The method of claim 13 wherein the logic circuit is an AND gate.

20. The method of claim 13 wherein the inverter is driven by at least the supply voltage.

* * * * *